US010763892B1

(12) United States Patent
Basov

(10) Patent No.: US 10,763,892 B1
(45) Date of Patent: Sep. 1, 2020

(54) MANAGING INLINE DATA COMPRESSION IN STORAGE SYSTEMS

(71) Applicant: EMC IP Holding Company LLC, Hopkinton, MA (US)

(72) Inventor: Ivan Basov, Brookline, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 368 days.

(21) Appl. No.: 15/281,252

(22) Filed: Sep. 30, 2016

(51) Int. Cl.
*G06F 7/00* (2006.01)
*H03M 7/30* (2006.01)
*G06F 16/22* (2019.01)
*G06F 16/23* (2019.01)

(52) U.S. Cl.
CPC .............. *H03M 7/30* (2013.01); *G06F 16/22* (2019.01); *G06F 16/2365* (2019.01)

(58) Field of Classification Search
CPC ......... G06F 17/30138; G06F 17/30047; G06F 17/30153; G06F 17/30076; G06F 17/30501; G06F 17/30215
See application file for complete search history.

(56) References Cited

U.S. PATENT DOCUMENTS

| | | | | |
|---|---|---|---|---|
| 7,386,046 B2* | 6/2008 | Fallon | ................ | H03M 7/3084 375/240 |
| 8,489,555 B2* | 7/2013 | Morris | .................... | H03M 7/30 707/661 |
| 9,213,717 B1* | 12/2015 | Pawar | ................ | G06F 16/1774 |
| 9,298,633 B1* | 3/2016 | Zhao | ................... | G06F 12/0862 |
| 9,342,518 B1* | 5/2016 | Sherry | .................... | G06F 16/48 |
| 9,398,633 B2* | 7/2016 | Batchu | .............. | H04W 52/0216 |
| 9,430,331 B1* | 8/2016 | Basov | ................ | G06F 11/1451 |
| 9,488,977 B2* | 11/2016 | Cho | ......................... | H04Q 9/00 |
| 9,571,698 B1* | 2/2017 | Wallace | ................. | H04N 19/10 |
| 9,588,977 B1* | 3/2017 | Wang | ...................... | G06F 16/13 |
| 9,606,870 B1* | 3/2017 | Meiri | .................. | G06F 11/1092 |
| 9,779,023 B1* | 10/2017 | Armangau | .......... | G06F 12/0875 |
| 2002/0191682 A1* | 12/2002 | Moon | .................. | H04B 7/2668 375/147 |
| 2002/0191692 A1* | 12/2002 | Fallon | ..................... | H03M 7/30 375/240 |
| 2007/0067326 A1* | 3/2007 | Morris | .................... | H03M 7/30 |
| 2008/0232457 A1* | 9/2008 | Fallon | ..................... | H03M 7/30 375/240 |
| 2009/0154545 A1* | 6/2009 | Fallon | ..................... | H03M 7/30 375/240 |
| 2010/0274926 A1* | 10/2010 | Marulkar | ................ | H03M 7/30 709/247 |
| 2011/0231377 A1* | 9/2011 | Morris | .................... | H03M 7/30 707/693 |
| 2016/0224599 A1* | 8/2016 | Sherry | ................... | G06F 16/48 |

* cited by examiner

*Primary Examiner* — Daniel A Kuddus
(74) *Attorney, Agent, or Firm* — Krishnendu Gupta; Nikhil Patel

(57) ABSTRACT

A method is usd in managing inline data compression in storage systems. Multiple requests are received to write data to a data object stored in a storage system. A range is determined for a system throughput rate for the storage system. Based on the range, performance of performing inline data compression of the data is assessed. Compressed data is produced prior to storing the data in the data object. Based on the assessment, performing inline data compression in the storage system is affected.

18 Claims, 2 Drawing Sheets

MANAGING INLINE DATA COMPRESSION IN STORAGE SYSTEMS

BACKGROUND

Technical Field

This application relates to managing inline data compression in storage systems.

Description of Related Art

Computer systems may include different resources used by one or more host processors. Resources and host processors in a computer system may be interconnected by one or more communication connections. These resources may include, for example, data storage devices such as those included in the data storage systems manufactured by EMC Corporation. These data storage systems may be coupled to one or more servers or host processors and provide storage services to each host processor. Multiple data storage systems from one or more different vendors may be connected and may provide common data storage for one or more host processors in a computer system.

A host processor may perform a variety of data processing tasks and operations using the data storage system. For example, a host processor may perform basic system I/O operations in connection with data requests, such as data read and write operations.

Host processor systems may store and retrieve data using a storage device containing a plurality of host interface units, disk drives, and disk interface units. The host systems access the storage device through a plurality of channels provided therewith. Host systems provide data and access control information through the channels to the storage device and the storage device provides data to the host systems also through the channels. The host systems do not address the disk drives of the storage device directly, but rather, access what appears to the host systems as a plurality of logical disk units. The logical disk units may or may not correspond to the actual disk drives. Allowing multiple host systems to access the single storage device unit allows the host systems to share data in the device. In order to facilitate sharing of the data on the device, additional software on the data storage systems may also be used.

Such a data storage system typically includes processing circuitry and a set of disk drives (disk drives are also referred to herein as simply "disks" or "drives"). In general, the processing circuitry performs load and store operations on the set of disk drives on behalf of the host devices. In certain data storage systems, the disk drives of the data storage system are distributed among one or more separate disk drive enclosures (disk drive enclosures are also referred to herein as "disk arrays" or "storage arrays") and processing circuitry serves as a front-end to the disk drive enclosures. The processing circuitry presents the disk drive enclosures to the host device as a single, logical storage location and allows the host device to access the disk drives such that the individual disk drives and disk drive enclosures are transparent to the host device.

Disk arrays are typically used to provide storage space for one or more computer file systems, databases, applications, and the like. For this and other reasons, it is common for disk arrays to be structured into logical partitions of storage space, called logical units (also referred to herein as LUs or LUNs). For example, at LUN creation time, storage system may allocate storage space of various storage devices in a disk array to be presented as a logical volume for use by an external host device. This allows a disk array to appear as a collection of separate file systems, network drives, and/or volumes. Disk arrays may also include groups of physical disks that are logically bound together to represent contiguous data storage space for applications.

Some data storage systems employ software compression and decompression to improve storage efficiency. For example, software compression involves loading compression instructions into memory and executing the instructions on stored data using one or more processing cores. A result of such software compression is that compressed data requires less storage space than the original, uncompressed data. Conversely, software decompression involves loading decompression instructions into the memory and executing the instructions on the compressed data using one or more of the processing cores, to restore the compressed data to its original, uncompressed form.

Other data storage systems perform compression and decompression in hardware. For example, a data storage system may include specialized hardware for compressing and decompressing data. The specialized hardware may be provided on the storage processor itself, e.g., as a chip, chipset, or sub-assembly, or on a separate circuit board assembly. Unlike software compression, which operates by running executable software instructions on a computer, hardware compression employs one or more ASICs (Application Specific Integrated Circuits), FPGAs (Field Programmable Gate Arrays), RISC (Reduced Instruction Set Computing) processors, and/or other specialized devices in which operations may be hard-coded and performed at high speed.

SUMMARY OF THE INVENTION

A method is usd in managing inline data compression in storage systems. Multiple requests are received to write data to a data object stored in a storage system. A range is determined for a system throughput rate for the storage system. Based on the range, performance of performing inline data compression of the data is assessed. Compressed data is produced prior to storing the data in the data object. Based on the assessment, performing inline data compression in the storage system is affected.

BRIEF DESCRIPTION OF THE DRAWINGS

Features and advantages of the present technique will become more apparent from the following detailed description of exemplary embodiments thereof taken in conjunction with the accompanying drawings in which.

DETAILED DESCRIPTION OF EMBODIMENT(S)

Figure 1:
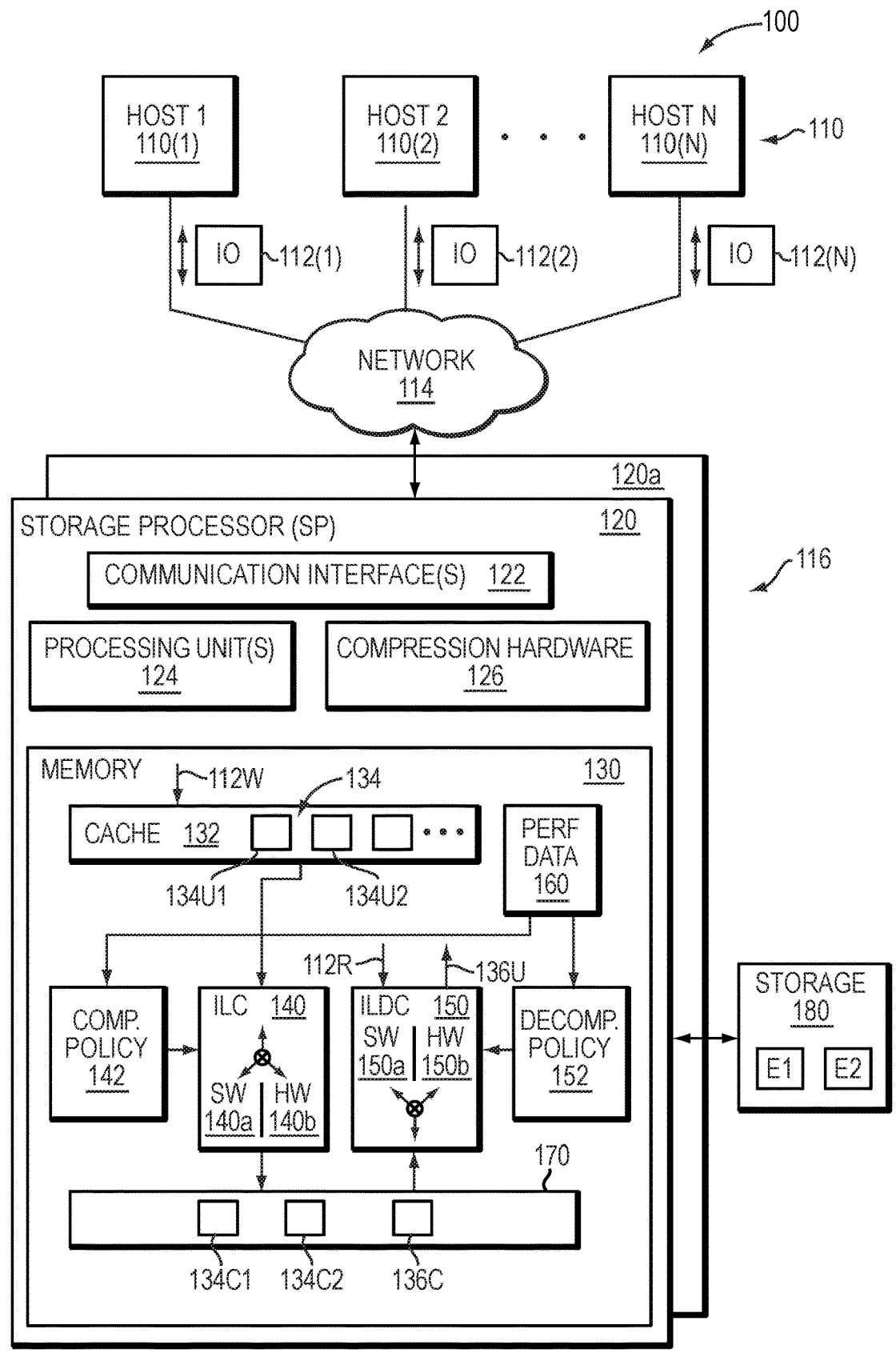
FIG. 1 is an example of an embodiment of a computer system that may utilize the techniques described herein.

Described below is a technique for use in managing inline data compression in storage systems, which technique may be used to provide, among other things, receiving multiple requests to write data to a data object stored in a storage system, determining a range for a system throughput rate for the storage system, based on the range, assessing performance of performing inline data compression of the data, where compressed data is produced prior to storing the data in the data object, and based on the assessment, effecting performing inline data compression in the storage system.

Data Compression is an efficiency feature that allows users to store information using less storage capacity than storage capacity used without compression. With data compression, users can significantly increase storage utilization for data such as file and block data. Data compression may be characterized as the process of encoding source information using an encoding scheme into a compressed form having fewer bits than the original or source information. Different encoding schemes may be used in connection with data compression. Compression may be a LUN attribute that can be enabled or disabled. When data compression is enabled, data on a LUN may be compressed as a background task. Compression may be performed in three different phases. First phase being an initial compression which occurs when data compression is first enabled for a LUN. Entire LUN may be processed during this phase. Second phase is compression of new data which is sent by a host when the host sends a write request to a LUN. In such a case, the data is written in an uncompressed format and compressed asynchronously in background at a later time. As a result, when new data is written to a compressed LUN, the consumed capacity of the compressed LUN may increase temporarily because the new data is not written in compressed format initially. Further, when a storage system receives a new write request directed to compressed data, the compressed data may need to be first uncompressed, the uncompressed data is updated with the new write request, and updated uncompressed data is compressed again. Alternatively, when a storage system receives a new write request directed to compressed data, the compressed data may be left as-is and new data may be written to a new location.

Inline compression (also referred to herein as "ILC") provides the ability to reduce the amount of storage required to store user data on a storage device of a storage system by compressing portions of the data at the time the data is first written to the storage device. Further, storage system resources such as CPU resources, that may otherwise remain unused, are utilized to perform inline data compression on a write data path indicating that data is compressed prior to writing the data on a storage device. Generally, ILC may be enabled by default on a storage system. However a user may be provided the ability to make a decision regarding which storage objects should be subject to compression. Further, ILC is intended to lower the cost of storage consumed (i.e., $/GB), but it is also a goal for ILC to improve the cost based on number of IO operations performed in a storage system (IOPs performed in a specific time) through better utilization.

Generally, performance of a storage system in which inline data compression is enabled is based on a set of factors such as load on a storage system, layout of a file system, a ratio of data compression, configuration of back-end devices, a unit of allocation for data, and the size of a data block. An I/O operation enabled with inline data compression replies on a set of factors such as using a few threads for flushing cached data, a specific number of processing cores and maximizing each bandwidth of each thread. In a conventional system, a user is unable to dynamically adjust a set of factors that impact performance of inline data compression as there does not exists any framework and/or structure to measure and assess performance of inline data compression indicating impact of inline data compression on performance of a storage system. In such a conventional system, a user is unable to assess how inline data compression impacts performance of a storage system. Thus, in such a conventional system, a user is unable to adjust the ratio for data compression in order to improve efficiency of a storage system.

By contrast, in at least some implementations in accordance with the technique provides a framework to measure and assess performance of inline data compression in a storage system. Thus, in at least one embodiment of the current technique, a user of a system is able to change inline data compression by determining which storage objects may be compressed and the ratio for data compression based on performance assessment of inline data compression in a storage system.

In at least some implementations in accordance with the technique as described herein, the use of the managing inline data compression in storage systems technique can provide one or more of the following advantages: improving storage utilization by adjusting inline data compression in a storage system based on performance assessment of inline data compression, improving storage system efficiency by measuring performance of inline data compression, and improving IO performance in a storage system by adjusting inline data compression.

FIG. 1 depicts an example embodiment of a system that may be used in connection with performing the techniques described herein. Here, multiple host computing devices ("hosts") 110, shown as devices 110(1) through 110(N), access a data storage system 116 over a network 114. The data storage system 116 includes a storage processor, or "SP," 120 and storage 180. In an example, the storage 180 includes multiple disk drives, such as magnetic disk drives, electronic flash drives, optical drives, and/or other types of drives. Such disk drives may be arranged in RAID (Redundant Array of Independent/Inexpensive Disks) groups, for example, or in any other suitable way.

In an example, the data storage system 116 includes multiple SPs, like the SP 120 (e.g., a second SP, 120a). The SPs may be provided as circuit board assemblies, or "blades," which plug into a chassis that encloses and cools the SPs. The chassis may have a backplane for interconnecting the SPs, and additional connections may be made among SPs using cables. No particular hardware configuration is required, however, as any number of SPs, including a single SP, may be provided and the SP 120 can be any type of computing device capable of processing host IOs.

The network 114 may be any type of network or combination of networks, such as a storage area network (SAN), a local area network (LAN), a wide area network (WAN), the Internet, and/or some other type of network or combination of networks, for example. The hosts 110(1-N) may connect to the SP 120 using various technologies, such as Fibre Channel, iSCSI, NFS, SMB 3.0, and CIFS, for example. Any number of hosts 110(1-N) may be provided, using any of the above protocols, some subset thereof, or other protocols besides those shown. As is known, Fibre Channel and iSCSI are block-based protocols, whereas NFS, SMB 3.0, and CIFS are file-based protocols. The SP 120 is configured to receive IO (input/output) requests 112(1-N) according to block-based and/or file-based protocols and to respond to such IO requests 112(1-N) by reading and/or writing the storage 180.

As further shown in FIG. 1, the SP 120 includes one or more communication interfaces 122, a set of processing units 124, compression hardware 126, and memory 130. The communication interfaces 122 may be provided, for example, as SCSI target adapters and/or network interface adapters for converting electronic and/or optical signals received over the network 114 to electronic form for use by the SP 120. The set of processing units 124 includes one or more processing chips and/or assemblies. In a particular example, the set of processing units 124 includes numerous multi-core CPUs.

The compression hardware 126 includes dedicated hardware, e.g., one or more integrated circuits, chipsets, sub-assemblies, and the like, for performing data compression and decompression in hardware. The hardware is "dedicated" in that it does not perform general-purpose computing but rather is focused on compression and decompression of data. In some examples, compression hardware 126 takes the form of a separate circuit board, which may be provided as a daughterboard on SP 120 or as an independent assembly that connects to the SP 120 over a backplane, midplane, or set of cables, for example. A non-limiting example of compression hardware 126 includes the Intel® QuickAssist Adapter, which is available from Intel Corporation of Santa Clara, Calif.

The memory 130 includes both volatile memory (e.g., RAM), and non-volatile memory, such as one or more ROMs, disk drives, solid state drives, and the like. The set of processing units 124 and the memory 130 together form control circuitry, which is constructed and arranged to carry out various methods and functions as described herein. Also, the memory 130 includes a variety of software constructs realized in the form of executable instructions. When the executable instructions are run by the set of processing units 124, the set of processing units 124 are caused to carry out the operations of the software constructs. Although certain software constructs are specifically shown and described, it is understood that the memory 130 typically includes many other software constructs, which are not shown, such as an operating system, various applications, processes, and daemons.

As further shown in FIG. 1, the memory 130 "includes," i.e., realizes by execution of software instructions, a cache 132, an inline compression (ILC) engine 140, an inline decompression (ILDC) engine 150, and a data object 170. A compression policy 142 provides control input to the ILC engine 140, and a decompression policy 152 provides control input to the ILDC engine 150. Both the compression policy 142 and the decompression policy 152 receive performance data 160, which describe a set of operating conditions in the data storage system 116.

In an example, the data object 170 is a host-accessible data object, such as a LUN (Logical UNit), a file system, or a virtual machine disk (e.g., a VVol, available from VMWare, Inc. of Palo Alto, Calif.). The SP 120 exposes the data object 170 to hosts 110 for reading, writing, and/or other data operations. In one particular, non-limiting example, the SP 120 runs an internal file system and implements data object 170 within a single file of that file system. In such an example, the SP 120 includes mapping (not shown) to convert read and write requests from hosts 110 (e.g., IO requests 112(1-N)) to corresponding reads and writes to the file in the internal file system.

As further shown in FIG. 1, ILC engine 140 includes a software component (SW) 140a and a hardware component (HW) 140b. The software component 140a includes a compression method, such as an algorithm, which may be implemented using software instructions. Such instructions may be loaded in memory and executed by processing units 124, or some subset thereof, for compressing data directly, i.e., without involvement of the compression hardware 126. In comparison, the hardware component 140b includes software constructs, such as a driver and API (application programmer interface) for communicating with compression hardware 126, e.g., for directing data to be compressed by the compression hardware 126. In some examples, either or both components 140a and 140b supports multiple compression algorithms. The compression policy 142 and/or a user may select a compression algorithm best suited for current operating conditions, e.g., by selecting an algorithm that produces a high compression ratio for some data, by selecting an algorithm that executes at high speed for other data, and so forth. For decompressing data, the ILDC engine 150 includes a software component (SW) 150a and a hardware component (HW) 150b. The software component 150a includes a decompression algorithm implemented using software instructions, which may be loaded in memory and executed by any of processing units 124 for decompressing data in software, without involvement of the compression hardware 126. The hardware component 150b includes software constructs, such as a driver and API for communicating with compression hardware 126, e.g., for directing data to be decompressed by the compression hardware 126. Either or both components 150a and 150b may support multiple decompression algorithms. In some examples, the ILC engine 140 and the ILDC engine 150 are provided together in a single set of software objects, rather than as separate objects, as shown.

In example operation, hosts 110(1-N) issue IO requests 112(1-N) to the data storage system 116 to perform reads and writes of data object 170. SP 120 receives the IO requests 112(1-N) at communications interface(s) 122 and passes them to memory 130 for further processing. Some IO requests 112(1-N) specify data writes 112W, and others specify data reads 112R. Cache 132 receives write requests 112W and stores data specified thereby in cache elements 134. In a non-limiting example, the cache 132 is arranged as a circular data log, with data elements 134 that are specified in newly-arriving write requests 112W added to a head and with further processing steps pulling data elements 134 from a tail. In an example, the cache 132 is implemented in DRAM (Dynamic Random Access Memory), the contents of which are mirrored between SPs 120 and 120a and persisted using batteries. In an example, SP 120 may acknowledge writes 112 W back to originating hosts 110 once the data specified in those writes 112 W are stored in the cache 132 and mirrored to a similar cache on SP 120a. It should be appreciated that the data storage system 116 may host multiple data objects, i.e., not only the data object 170, and that the cache 132 may be shared across those data objects.

When the SP 120 is performing writes, the ILC engine 140 selects between the software component 140a and the hardware component 140b based on input from the compression policy 142. For example, the ILC engine 140 is configured to steer incoming write requests 112W either to the software component 140a for performing software compression or to the hardware component 140b for performing hardware compression.

In an example, cache 132 flushes to the respective data objects, e.g., on a periodic basis. For example, cache 132 may flush element 134U1 to data object 170 via ILC engine 140. In accordance with compression policy 142, ILC engine 140 selectively directs data in element 134U1 to software component 140a or to hardware component 140b. In this example, compression policy 142 selects software component 140a. As a result, software component 140a receives the data of element 134U1 and applies a software compression algorithm to compress the data. The software compression algorithm resides in the memory 130 and is executed on the data of element 134U1 by one or more of the processing units 124. Software component 140a then directs the SP 120 to store the resulting compressed data 134C1 (the compressed version of the data in element 134U1) in the data object 170. Storing the compressed data 134C1 in data object 170 may involve both storing the data itself and storing any metadata structures required to support the data 134C1, such as block pointers, a compression header, and other metadata.

It should be appreciated that this act of storing data 134C1 in data object 170 provides the first storage of such data in the data object 170. For example, there was no previous storage of the data of element 134U1 in the data object 170. Rather, the compression of data in element 134U1 proceeds "inline" because it is conducted in the course of processing the first write of the data to the data object 170.

Continuing to another write operation, cache 132 may proceed to flush element 134U2 to data object 170 via ILC engine 140, which, in this case, directs data compression to hardware component 140b, again in accordance with policy 142. As a result, hardware component 140b directs the data in element 134U2 to compression hardware 126, which obtains the data and performs a high-speed hardware compression on the data. Hardware component 140b then directs the SP 120 to store the resulting compressed data 134C2 (the compressed version of the data in element 134U2) in the data object 170. Compression of data in element 134U2 also takes place inline, rather than in the background, as there is no previous storage of data of element 134U2 in the data object 170.

In an example, directing the ILC engine 140 to perform hardware or software compression further entails specifying a particular compression algorithm. The algorithm to be used in each case is based on compression policy 142 and/or specified by a user of the data storage system 116. Further, it should be appreciated that compression policy 142 may operate ILC engine 140 in a pass-through mode, i.e., one in which no compression is performed. Thus, in some examples, compression may be avoided altogether if the SP 120 is too busy to use either hardware or software compression.

In some examples, storage 180 is provided in the form of multiple extents, with two extents E1 and E2 particularly shown. In an example, the data storage system 116 monitors a "data temperature" of each extent, i.e., a frequency of read and/or write operations performed on each extent, and selects compression algorithms based on the data temperature of extents to which writes are directed. For example, if extent E1 is "hot," meaning that it has a high data temperature, and the data storage system 116 receives a write directed to E1, then compression policy 142 may select a compression algorithm that executes at high speed for compressing the data directed to E1. However, if extent E2 is "cold," meaning that it has a low data temperature, and the data storage system 116 receives a write directed to E2, then compression policy 142 may select a compression algorithm that executes at high compression ratio for compressing data directed to E2.

When SP 120 performs reads, the ILDC engine 150 selects between the software component 150a and the hardware component 150b based on input from the decompression policy 152 and also based on compatible algorithms. For example, if data was compressed using a particular software algorithm for which no corresponding decompression algorithm is available in hardware, the ILDC engine 150 may steer the compressed data to the software component 150a, as that is the only component equipped with the algorithm needed for decompressing the data. However, if both components 150a and 150b provide the necessary algorithm, then selection among components 150a and 150b may be based on decompression policy 152.

To process a read request 112R directed to compressed data 136C, the ILDC engine 150 accesses metadata of the data object 170 to obtain a header for the compressed data 136C. The compression header specifies the particular algorithm that was used to compress the data 136C. The ILDC engine 150 may then check whether the algorithm is available to software component 150a, to hardware component 150b, or to both. If the algorithm is available only to one or the other of components 150a and 150b, the ILDC engine 150 directs the compressed data 136C to the component that has the necessary algorithm. However, if the algorithm is available to both components 150a and 150b, the ILDC engine 150 may select between components 150a and 150b based on input from the decompression policy 152. If the software component 150a is selected, the software component 150a performs the decompression, i.e., by executing software instructions on one or more of the set of processors 124. If the hardware component 150b is selected, the hardware component 150b directs the compression hardware 126 to decompress the data 136C. The SP 120 then returns the resulting uncompressed data 136U to the requesting host 110.

It should be appreciated that the ILDC engine 150 is not required to use software component 150a to decompress data that was compressed by the software component 140a of the ILC engine 140. Nor is it required that the ILDC engine 150 use hardware component 150b to decompress data that was compressed by the hardware component 140b. Rather, the component 150a or 150b may be selected flexibly as long as algorithms are compatible. Such flexibility may be especially useful in cases of data migration. For example, consider a case where data object 170 is migrated to a second data storage system (not shown). If the second data storage system does not include compression hardware 126, then any data compressed using hardware on data storage system 116 may be decompressed on the second data storage system using software.

With the arrangement of FIG. 1, the SP 120 intelligently directs compression and decompression tasks to software or to hardware based on operating conditions in the data storage system 116. For example, if the set of processing units 124 are already busy but the compression hardware 126 is not, the compression policy 142 can direct more compression tasks to hardware component 140b. Conversely, if compression hardware 126 is busy but the set of processing units 124 are not, the compression policy 142 can direct more compression tasks to software component 140a. Decompression policy 152 may likewise direct decompression tasks based on operating conditions, at least to the extent that direction to hardware or software is not already dictated by the algorithm used for compression. In this manner, the data storage system 116 is able to perform inline compression using both hardware and software techniques, leveraging the capabilities of both while applying them in proportions that result in best overall performance.

In such an embodiment in which element 120 of FIG. 1 is implemented using one or more data storage systems, each of the data storage systems may include code thereon for performing the techniques as described herein.

Servers or host systems, such as 110(1)-110(N), provide data and access control information through channels to the storage systems, and the storage systems may also provide data to the host systems also through the channels. The host systems may not address the disk drives of the storage systems directly, but rather access to data may be provided to one or more host systems from what the host systems view as a plurality of logical devices or logical volumes (LVs). The LVs may or may not correspond to the actual disk drives. For example, one or more LVs may reside on a single physical disk drive. Data in a single storage system may be accessed by multiple hosts allowing the hosts to share the data residing therein. An LV or LUN (logical unit number) may be used to refer to the foregoing logically defined devices or volumes.

The data storage system may be a single unitary data storage system, such as single data storage array, including two storage processors or compute processing units. Techniques herein may be more generally use in connection with any one or more data storage system each including a different number of storage processors than as illustrated herein. The data storage system 116 may be a data storage array, such as a VNX™ or VNXe™ data storage array by EMC Corporation of Hopkinton, Mass., including a plurality of data storage devices 116 and at least two storage processors 120a. Additionally, the two storage processors 120a may be used in connection with failover processing when communicating with a management system for the storage system. Client software on the management system may be used in connection with performing data storage system management by issuing commands to the data storage system 116 and/or receiving responses from the data storage system 116 over a connection. In one embodiment, the management system may be a laptop or desktop computer system.

The particular data storage system as described in this embodiment, or a particular device thereof, such as a disk, should not be construed as a limitation. Other types of commercially available data storage systems, as well as processors and hardware controlling access to these particular devices, may also be included in an embodiment.

In some arrangements, the data storage system 116 provides block-based storage by storing the data in blocks of logical storage units (LUNs) or volumes and addressing the blocks using logical block addresses (LBAs). In other arrangements, the data storage system 116 provides file-based storage by storing data as files of a file system and locating file data using inode structures. In yet other arrangements, the data storage system 116 stores LUNs and file systems, stores file systems within LUNs, and so on.

Further, example sources of performance data, which indicate an operating condition of the data storage system 116 may include, for example, percent-utilization of compression hardware 126. Such percent-utilization may range from 0% (inactive) to 100% (active and fully saturated). The performance data may further includes measures of percent-utilization, i.e., one for each of M processor cores in the set of processing units 124. In addition, SP 120 may maintain counters that maintains a count of active compression jobs (e.g., tasks or threads) running on compression hardware 126, and maintains a count of active compression threads running in software, i.e., being executed by the set of processing units 124. Each time a new compression job or thread is started, the SP 120 increments the corresponding counters.

Likewise, each time a compression job or thread finishes, the SP 120 decrements the corresponding counter. The particular sources of performance data described above herein are intended to be illustrative rather than exhaustive. For example, additional counters may be provided for numbers of decompression jobs and/or threads, numbers of compression jobs or threads pending (e.g., waiting in line for processing), and so forth.

In at least one embodiment of the current technique, estimation of performance of a storage system enabled with inline data compression may be determined by using an algorithmic formula described below herein:

$$R_{on} = (R_c^{-p} + \rho_c^p R_{off}^{-p})^{-\frac{1}{p}}, p \geq 1$$

Where:

$R_{on}$—The rate at which IO operations are performed in a storage system with inline data compression mode set as "on" indicating data is written to a storage device in compressed format.

$R_{off}$—The rate at which IO operations are performed in a storage system with inline data compression mode set as "off" indicating read and/or write IO requests read and/or write data in uncompressed format;

$R_c$—The rate at which inline data compression is performed (also referred to herein as "compression speed") when no IO operations are being processed in a storage system.

$\rho_c$—Compression ratio which is defined as $$\rho_c = \frac{\text{compressed data size}}{\text{original data size}}.$$

p—Interaction parameter. A high value of interaction parameter indicates a high performance of a storage system. A set of factors such as a number of threads concurrently executing in a storage system indicating multithreading, prefetching of data, and caching of data increases the value of interaction parameter and minimizes a set of factors impacting performance of the storage system.

In at least one embodiment of the current technique, for example, if IO throughput/rate without inline data compression being enabled in a storage system be $$R_{off} = 50 \frac{\text{MB}}{\text{Sec}}$$

indicating that the storage system processes 50 Megabytes (MB) of data I IO operations per second, compression rate be $$R_c = 200 \frac{\text{MB}}{\text{Sec}}$$

indicating that the storage system compresses 200 MB of data per second, compression ratio be $\rho_c$=0.5 (i.e., 50%, or 2:1 compression) indicating that data is compressed by 50%, and assuming that the interaction parameter is p=4. In such a case, system/file system throughput rate with inline data compression enabled and set as "on" is calculated as $$R_{on} = (R_c^{-p} + \rho_c^p R_{off}^{-p})^{-\frac{1}{p}} = (200^{-4} + 0.5^4 50^{-4})^{-\frac{1}{4}} = 100(2^{-4} + 1)^{-\frac{1}{4}} = 98 \frac{\text{Mb}}{\text{Sec}}$$

Further, for example, if the value of the interaction parameter is assumed as 1 indicating a scenario with the worst system performance in a storage system, the rate at which IO operations are performed in a storage system with inline data compression mode set as "on" may be determined as follows:

$$R_{on}(1) = (R_c^{-1} + \rho_c^1 R_{off}^{-1})^{-1} = \frac{R_c R_{off}}{\rho_c R_c + R_{off}}.$$

Above example indicates that in such a storage system, processing that compresses data and IO operations do not interact and are performed sequentially without any multi-threading capability in such storage system.

Assuming the values of various parameters from the example described above herein with interaction parameter set as 1, the rate at which IO operations are performed in a storage system with inline data compression mode set as "on" is computed as 67 MB per second as described below.

$$R_{on}(1) = \frac{R_c R_{off}}{\rho_c R_c + R_{off}} = \frac{200 \times 50}{0.5 \times 200 + 50} = 67 \frac{Mb}{Sec}$$

Thus, the rate at which IO operations are performed in a storage system with inline data compression mode set as "on" with interaction parameter value set as 1 indicates the lowest value for the rate at which such IO operations are performed.

Further, for example, if the value of the interaction parameter is assumed as an infinite value indicating a scenario with the best system performance in a storage system indicating that the interaction between inline data compression processing and IO operations is significant indicating that such processing is performed concurrently, the rate at which IO operations are performed in a storage system with inline data compression mode set as "on" may be determined as follows:

$$R_{on}(\infty) = \lim_{p \to \infty} (R_c^{-p} + \rho_c^p R_{off}^{-p})^{-\frac{1}{p}} = \min\left(R_c, \frac{R_{off}}{\rho_c}\right)$$

Assuming the values of various parameters from the example described above herein with interaction parameter set as infinity, the rate at which IO operations are performed in a storage system with inline data compression mode set as "on" is computed as 100 MB per second.

$$R_{on}(\infty) = \min\left(R_c, \frac{R_{off}}{\rho_c}\right) = \min\left(200, \frac{50}{0.5}\right) = \min(200, 100) = 100 \frac{Mb}{Sec}$$

Thus, the rate at which IO operations are performed in a storage system with inline data compression mode set as "on" with interaction parameter value set as infinity indicates the highest value for the rate at which such IO operations are performed.

Consequently, in at least one embodiment of the current technique, the lowest and highest values for the rate at which IO operations are performed in a storage system with inline data compression mode set as "on" indicates a range for the IO rate with inline data compression enabled "on". Thus, the range for IO rate with inline data compression enabled on a storage system is described as follows:

$$\frac{R_c R_{off}}{\rho_c R_c + R_{off}} \leq R_{on} \leq \min\left(R_c, \frac{R_{off}}{\rho_c}\right)$$

Thus, in at least one embodiment of the current technique, based on a range computed by using mathematical expressions:

$$R_{on}(p) = (R_c^{-p} + \rho_c^p R_{off}^{-p})^{-\frac{1}{p}} \text{ and}$$

$$R_{on}(\infty) = \min\left(R_c, \frac{R_{off}}{\rho_c}\right)$$

a user may make a determination that compressing data may not have a positive impact on performance of a storage system if IO rate indicated by $R_{on}$ is higher in value than compression rate indicated by $R_c$ or if the compression ratio is a high indicating that data is difficult or impossible to compress. Thus, in at least one embodiment of the current technique, based on a range determined by a storage system for IO rate with inline data compression enabled as described above herein enables a user to adjust a set of factors to improve efficiency and performance of the storage system.

Figure 2:
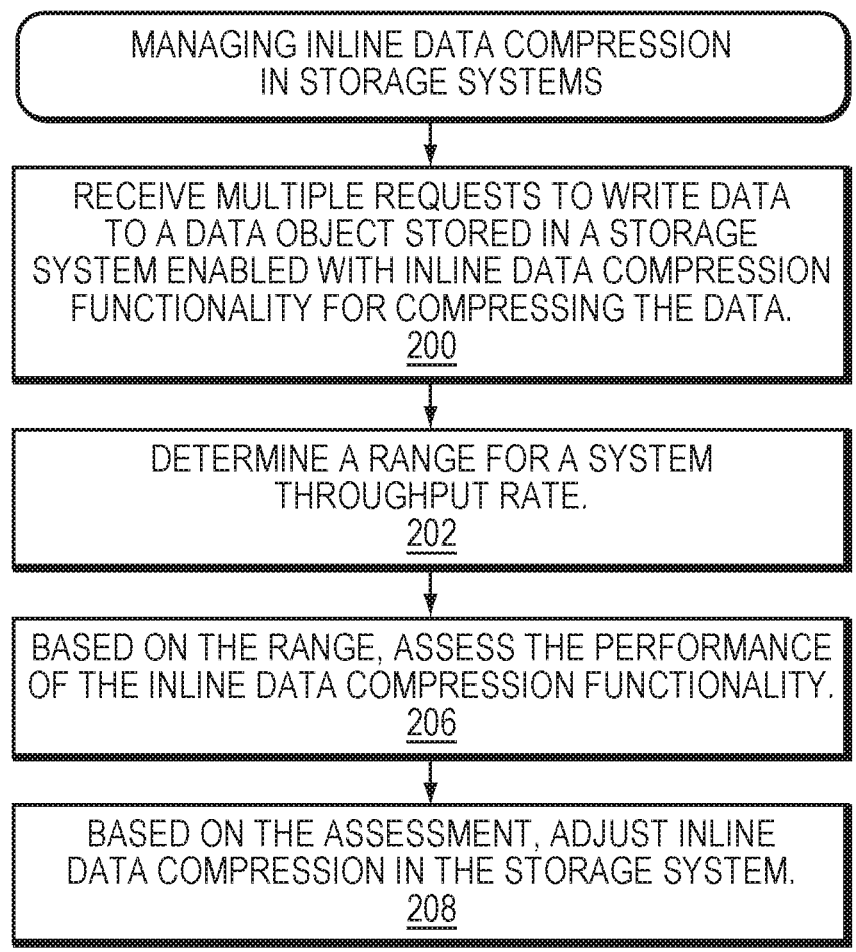
FIG. 2 is a flow diagram illustrating processes that may be used in connection with techniques herein.

Referring to FIG. 2, shown is a more detailed flow diagram illustrating managing mapping metadata in storage systems. With reference also to FIG. 1, in at least one embodiment of the current technique, a storage system receive multiple requests to write data to a data object stored in a storage system that has been enabled with inline data compression functionality for compressing the data (Step 200). Further, a range for a system throughput indicating IO rate with inline data compression enabled is determined based on mathematical expression described above herein (step 202). Based on the range computed with interaction parameter set as "1" and infinity respectively, performance of inline data compression functionality is assessed by comparing the computed range with the current performance of the storage system indicated by the current IO rate determined for the storage system (step 206). Based on the assessment, a user is able to adjust inline data compression in the storage system in order to improve performance of the storage system (step 208). Thus, for example, in such a system, if a user makes a determination that IO rate or system throughput of the storage system is not within the range computed with interaction parameter set as "1" and infinity respectively, any number of parameters such as the compression ratio, backend configuration, the number of threads executing concurrently, system load may be changed to improve performance of the storage system.

It should again be emphasized that the technique implementations described above are provided by way of illustration, and should not be construed as limiting the present invention to any specific embodiment or group of embodiments. For example, the invention can be implemented in other types of systems, using different arrangements of processing devices and processing operations. Also, message formats and communication protocols utilized may be varied in alternative embodiments. Moreover, various simplifying assumptions made above in the course of describing the illustrative embodiments should also be viewed as exemplary rather than as requirements or limitations of the invention. Numerous alternative embodiments within the scope of the appended claims will be readily apparent to those skilled in the art.

Furthermore, as will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

The flowchart and block diagrams in the FIGs illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the FIGs. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method for managing inline data compression in storage systems, the method comprising:
    receiving multiple requests to write data to a data object stored in a storage system;
    determining a range for a system throughput rate for the storage system;
    based on the range, assessing performance of performing inline data compression of the data, wherein compressed data is produced prior to storing the data in the data object;
    determining a data temperature of a storage area to which the write data is directed;
    based on the assessment and the data temperature of the storage area, setting a compression ratio for inline data compression in the storage system and changing at least one or more of: a backend configuration, a number of threads executing concurrently, and a system load; and
    directing compression tasks to software or hardware based on operating conditions of the storage system, wherein a compression rate indicates a rate at which IO (input output) operations are performed in the storage system with inline data compression disabled in the storage system indicating data is stored in uncompressed format in the storage system.

2. The method of claim 1, wherein an interaction parameter indicates performance of inline data compression in the storage system, wherein a high value for the interaction parameter indicates a high performance of inline data compression in the storage system, wherein a low value for the interaction parameter indicates a low performance of inline data compression in the storage system.

3. The method of claim 1, wherein the performance of inline data compression is based on a set of factors, wherein the set of factors include the number of threads concurrently executing in the storage system, prefetching of data, and caching of data.

4. The method of claim 1, wherein a compression IO rate indicates a rate at which IO operations are performed in the storage system when inline data compression is being applied in the storage system, wherein data is written to a storage device in compressed format.

5. The method of claim 2, wherein a minimum compression IO rate is computed by assuming a value of one for the interaction parameter indicating a minimum value for performance of inline data compression in the storage system.

6. The method of claim 5, wherein a maximum compression IO rate is computed by assuming a value of infinity for the interaction parameter indicating a maximum value for performance of inline data compression in the storage system.

7. The method of claim 6, wherein the range is comprised of the minimum and maximum compression IO rates.

8. The method of claim 6, further comprising
    determining whether the system throughput rate is within the range of the minimum and maximum compression IO rates; and
    based on the determination, changing a set of factors concerning the inline data compression in the storage system, wherein the set of factors includes backend configuration of the storage system, a number of threads executing concurrently in the storage system, and system load.

9. The method of claim 1, wherein assessing performance of inline data compression is performed by a utility executing on the storage system.

10. A system configured to manage inline data compression in storage systems, the system comprising a processor configured to:
    receive multiple requests to write data to a data object stored in a storage system;
    determine a range for a system throughput rate for the storage system;
    based on the range, assess performance of performing inline data compression of the data, wherein compressed data is produced prior to storing the data in the data object;
    determine a data temperature of a storage area to which the write data is directed;

based on the assessment and the data temperature of the storage area, set a compression ratio for inline data compression in the storage system and changing at least one or more of: a backend configuration, a number of threads executing concurrently, and a system load; and direct compression tasks to software or hardware based on operating conditions of the storage system, wherein a compression rate indicates a rate at which IO (input output) operations are performed in the storage system with inline data compression disabled in the storage system indicating data is stored in uncompressed format in the storage system.

11. The system of claim 10, wherein an interaction parameter indicates performance of inline data compression in the storage system, wherein a high value for the interaction parameter indicates a high performance of inline data compression in the storage system, wherein a low value for the interaction parameter indicates a low performance of inline data compression in the storage system.

12. The system of claim 10, wherein the performance of inline data compression is based on a set of factors, wherein the set of factors include the number of threads concurrently executing in the storage system, prefetching of data, and caching of data.

13. The system of claim 10, wherein a compression IO rate indicates a rate at which IO operations are performed in the storage system when inline data compression is being applied in the storage system, wherein data is written to a storage device in compressed format.

14. The system of claim 11, wherein a minimum compression IO rate is computed by assuming a value of one for the interaction parameter indicating a minimum value for performance of inline data compression in the storage system.

15. The system of claim 14, wherein a maximum compression IO rate is computed by assuming a value of infinity for the interaction parameter indicating a maximum value for performance of inline data compression in the storage system.

16. The system of claim 15, wherein the range is comprised of the minimum and maximum compression IO rates.

17. The system of claim 15, further comprising
determine whether the system throughput rate is within the range of the minimum and maximum compression IO rates; and
based on the determination, change a set of factors concerning the inline data compression in the storage system, wherein the set of factors includes backend configuration of the storage system, a number of threads executing concurrently in the storage system, and system load.

18. The system of claim 10, wherein assessing performance of inline data compression is performed by a utility executing on the storage system.

* * * * *